United States Patent
Chang et al.

(10) Patent No.: US 7,289,376 B2
(45) Date of Patent: Oct. 30, 2007

(54) METHOD FOR ELIMINATING CROSSTALK IN A METAL PROGRAMMABLE READ ONLY MEMORY

(75) Inventors: Meng-Fan Chang, Taipei (TW); Kuei-Ann Wen, Shangshan Village (TW)

(73) Assignee: National Chiao Tung University, Hsinchu (TW)

( * ) Notice: Subject to any disclaimer, the term of this patent is extended or adjusted under 35 U.S.C. 154(b) by 56 days.

(21) Appl. No.: 11/201,943

(22) Filed: Aug. 10, 2005

(65) Prior Publication Data

US 2006/0146587 A1    Jul. 6, 2006

(30) Foreign Application Priority Data

Dec. 30, 2004    (TW) .............................. 93141359 A

(51) Int. Cl.
    *G11C 7/10*    (2006.01)
(52) U.S. Cl. ................. 365/189.06; 365/203; 365/204
(58) Field of Classification Search ....... 365/189.06 O, 365/203 X, 204 X, 230.04, 189.06, 203, 365/204

See application file for complete search history.

(56) References Cited

U.S. PATENT DOCUMENTS

| | | | |
|---|---|---|---|
| 5,453,955 A | * | 9/1995 | Sakui et al. ................. 365/203 |
| 6,272,054 B1 | * | 8/2001 | Barth et al. ............ 365/189.06 |
| 6,587,364 B1 | | 7/2003 | Kablanian et al. |

* cited by examiner

*Primary Examiner*—VanThu Nguyen
(74) *Attorney, Agent, or Firm*—Bucknam and Archer

(57) ABSTRACT

The present invention provides a method for eliminating crosstalk (coupling noise) in a metal programmable read only memory. The metal programmable read only memory comprises a plurality of bit lines, a plurality of word lines, a plurality of precharge transistors, and a plurality of clamp transistors. When one of the bit lines is selected, bit lines adjacent to the selected bit line are fixed to a voltage value (VDD, GND or other voltages) by the clamp transistors. The clamping method can not cause voltage drops to the adjacent bit lines, and the crosstalk on the selected bit line can be eliminated simultaneously, so that the problem of read failures caused by the crosstalk in the high-speed metal programmable read only memory can be solved, and a higher speed can be reached.

4 Claims, 6 Drawing Sheets

METHOD FOR ELIMINATING CROSSTALK IN A METAL PROGRAMMABLE READ ONLY MEMORY

BACKGROUND OF THE INVENTION

1. Field of the Invention

The present invention relates to a method for eliminating crosstalk (coupling noise), and in particular to a method for eliminating crosstalk in a metal programmable read only memory.

2. Description of the Related Art

Typically, read only memories (ROMs) are embedded in system-on-chips (SoCs) for storing codes and wave tables. For much higher speed, large capacitance and shortened marketing time, there has been a trend to gradually use embedded read only memories in SoCs. In the prior art, when a word line is activated, crosstalk between bit lines will cause voltage drops to a selected bit line.

As shown in FIG. 1, BL-A1 and BL-A2 are bit lines with code patterns for reading a logic level "0". The voltage of BL-D (for reading a logic level "1") is larger than a reference voltage $V_{REF}$, and then, it is detected as a logic level "1"; the voltage of BL-V1 (for reading a logic level "1") is smaller than the reference voltage $V_{REF}$ and under the influence of the crosstalk from BL-A1, and it is detected as a logic level "0", resulting in a read error in a high-speed metal read only memory.

At present, there is still no method to resolve the problems of crosstalk caused by the above-stated code pattern dependence and read failures in a high-speed metal programmable read only memory.

SUMMARY OF THE INVENTION

An object of the present invention is to provide a method for eliminating crosstalk in a metal programmable read only memory. The method is used to resolve the problem of read failures caused by the crosstalk between a selected bit line and its adjacent bit lines, and can provide 100% of code pattern range for an NOR high-speed metal/contact/via-hole programmable read only memory.

In order to achieve the above object, the present invention provides a method for eliminating crosstalk in a metal programmable read only memory. The read only memory comprises a plurality of bit lines, each of which couples the drains of transistors together in the same column of 0-codes; a plurality of word lines, each of which couples the gates of transistors together in the same row; a plurality of precharge transistors, arranged on each of the bit lines, and the gates of which are coupled together by a precharge control line; and a plurality of clamp transistors, arranged on each of the bit lines and connected to a supply voltage for keeping the controlled bit lines stable in operation. When one of the bit lines is selected, two adjacent bit lines on both sides of the selected bit line are made to have a constant voltage by the clamp transistors.

In a preferred embodiment of the present invention, the clamp transistors are arranged in matrix on each of the bit lines, and during a word line pulse having a high logic level, the bit lines are fixed to a constant voltage.

Moreover, the present invention provides a method for eliminating crosstalk in a metal programmable read only memory. The read only memory comprises a plurality of bit lines, each of which couples the drains of transistors together in the same column of 0-codes; a plurality of word lines, each of which couples the gates of transistors together in the same row, wherein each of odd bit lines is arranged with a first transistor, each of even bit lines is arranged with a second transistor, a first precharge control line connects the gates of the first transistors of the odd bit lines together, and a second precharge control line connects the gates of the second transistors of the even bit lines together. When one of the odd or even bit lines is selected, the odd or even bit lines are fixed to a constant voltage by the control of clamp transistors corresponding to the bit lines.

In a preferred embodiment of the present invention, the first and second transistors have both functions of precharging and clamping voltage. During a word line pulse having a high logic level, the bit lines are fixed to a constant voltage by the control of clamp transistors corresponding to the bit lines.

In summary, the clamping method cannot cause voltage drops to adjacent bit lines and the coupling voltage on a selected bit line can be eliminated, so that the problem of read failures caused by the coupling voltage can be resolved.

DESCRIPTION OF THE PREFERRED EMBODIMENTS

At the beginning of each cycle, all bit lines are at the stage of precharging and will be precharged to a target voltage as a regular read only memory does. After an input address is decoded at a new cycle, the selected bit lines are connected to sense amplifiers through transistors controlled by column/row select signals Y [j]. During the activation of a word line (i.e., a word line pulse is at a high logic level), the selected and unselected bit lines are all in a read mode. However, the bit lines (on left and right sides) adjacent to the selected bit lines are clamped to a constant voltage (VDD, GND or other voltage) by transistors which are controlled by row select signals Y (as shown in FIG. 4) or programmable precharge control signals (pre_odd, pre_even) (as shown in FIG. 5).

Figure 1:
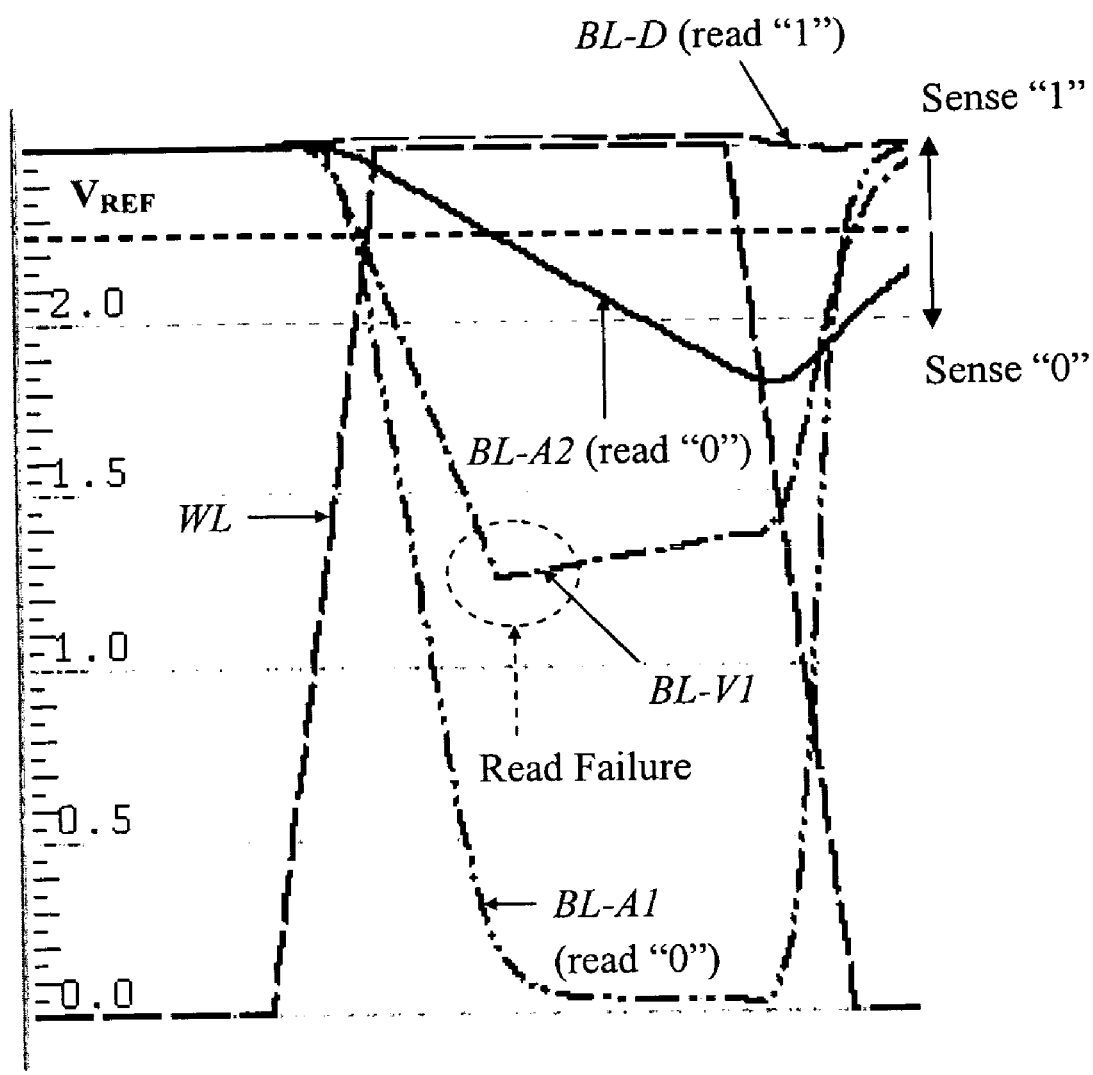
FIG. 1 is a schematic view showing a read error on a bit line in the prior art.
Figure 2:
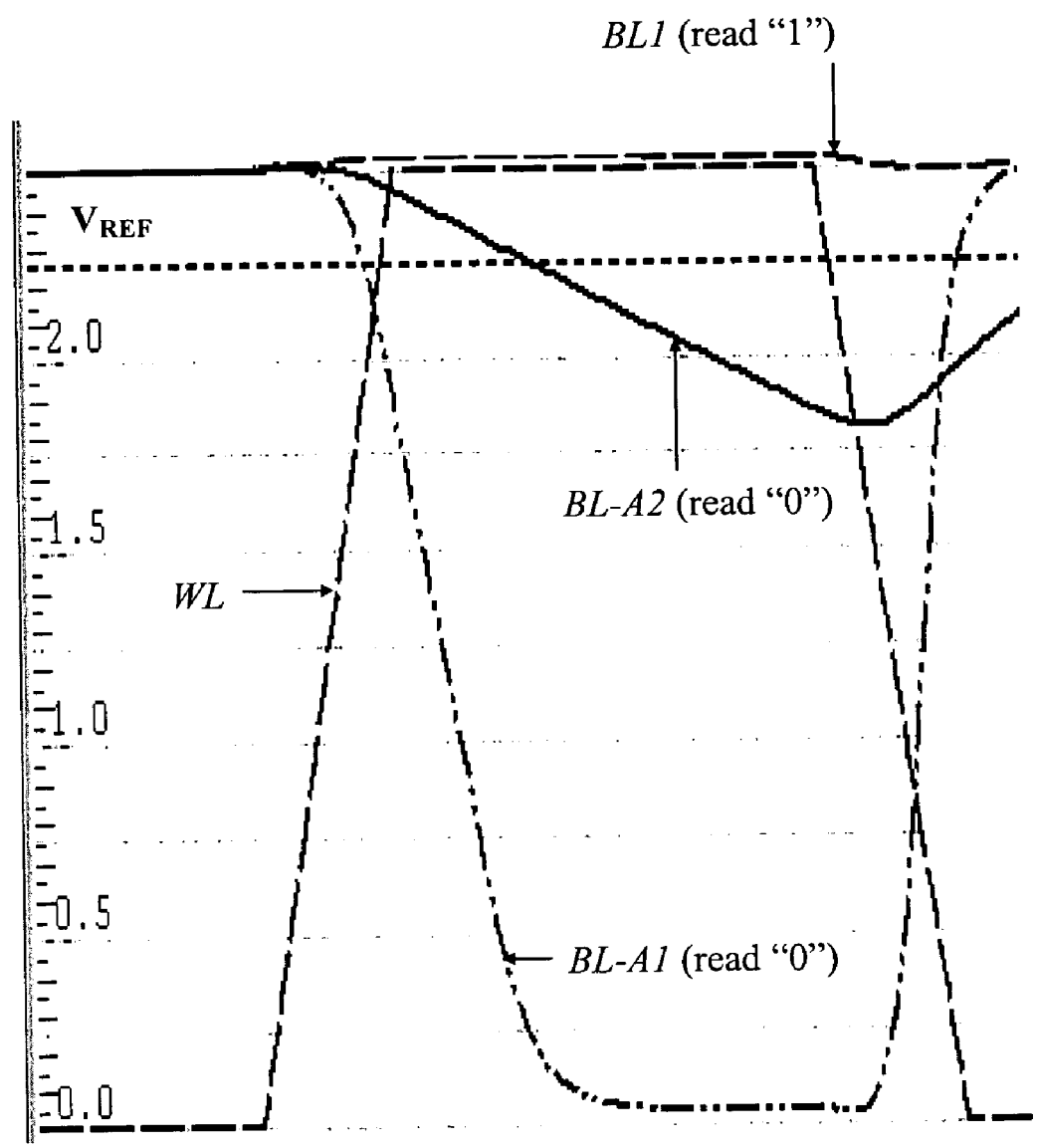
FIG. 2 is a schematic view showing bit line reading according to the present invention.
Figure 3:
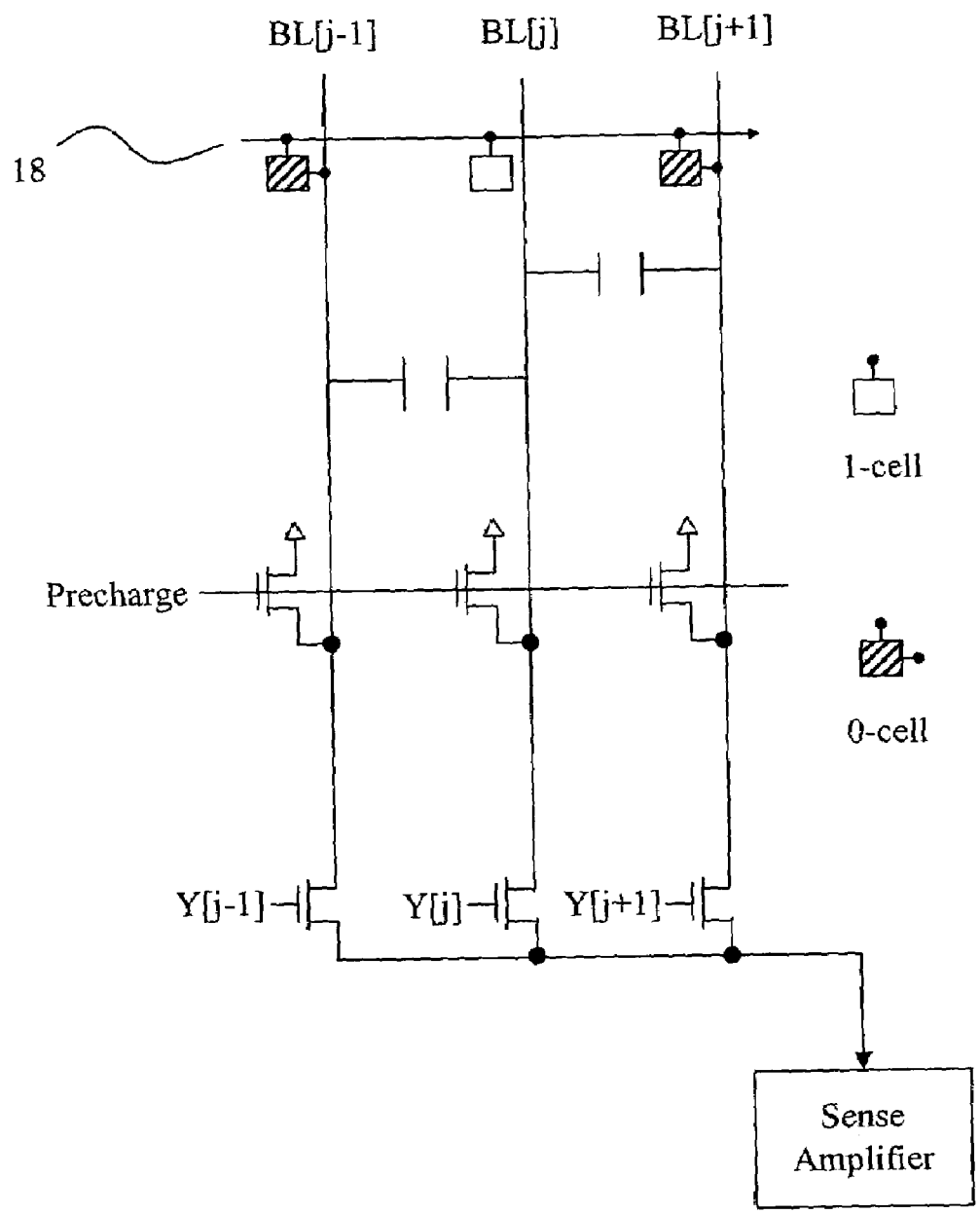
FIG. 3 is a circuit diagram showing a precharge circuit in a regular read only memory.

FIG. 2 is a schematic view showing bit line reading according to the present invention. Referring to FIG. 2, BL1 is a waveform of all the bit lines for reading a logic level "1". It is obvious from FIG. 2 that the influence of crosstalk is not caused in the present invention.

Figure 4:
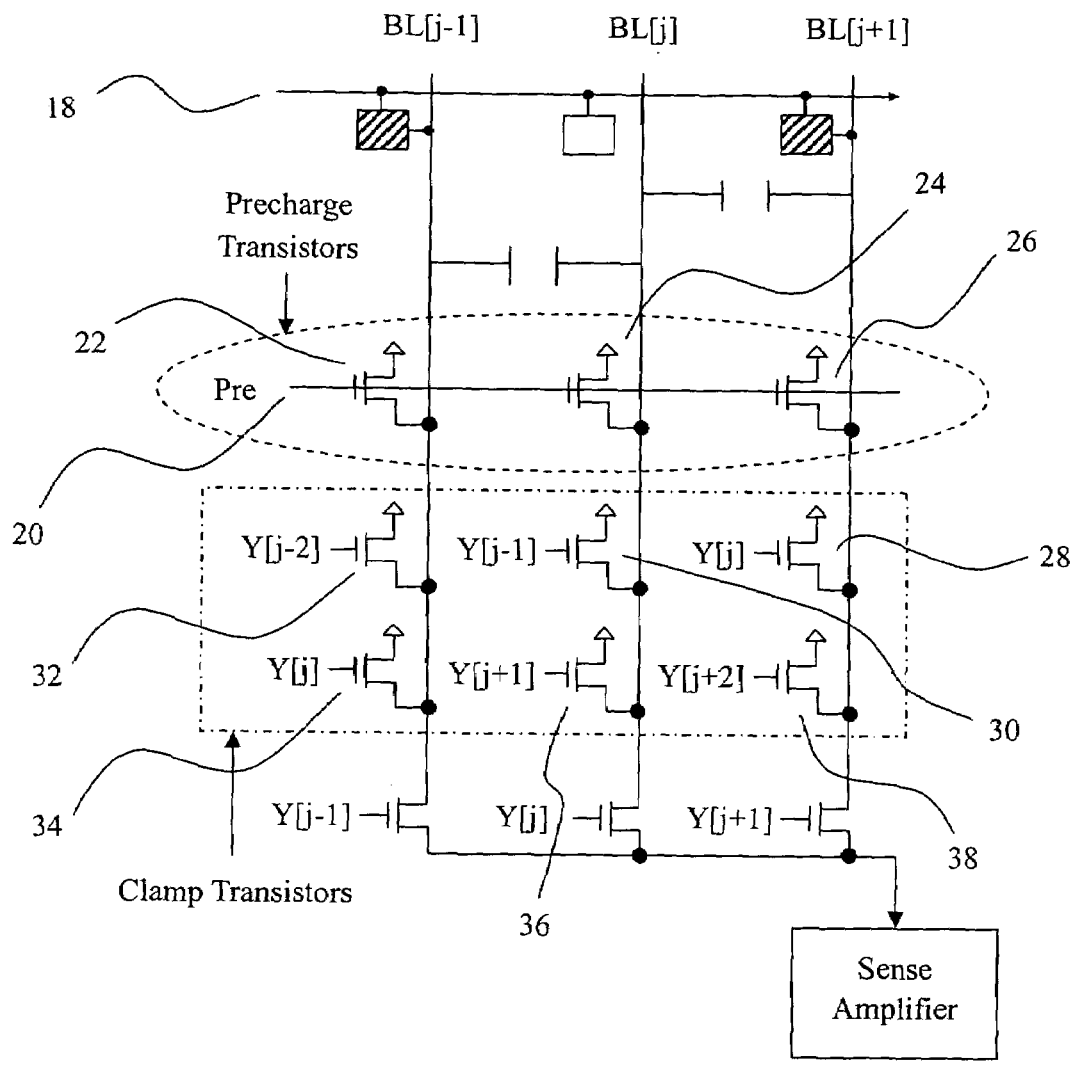
FIG. 4 is a circuit diagram according to a preferred embodiment of the present invention.
Figure 5:
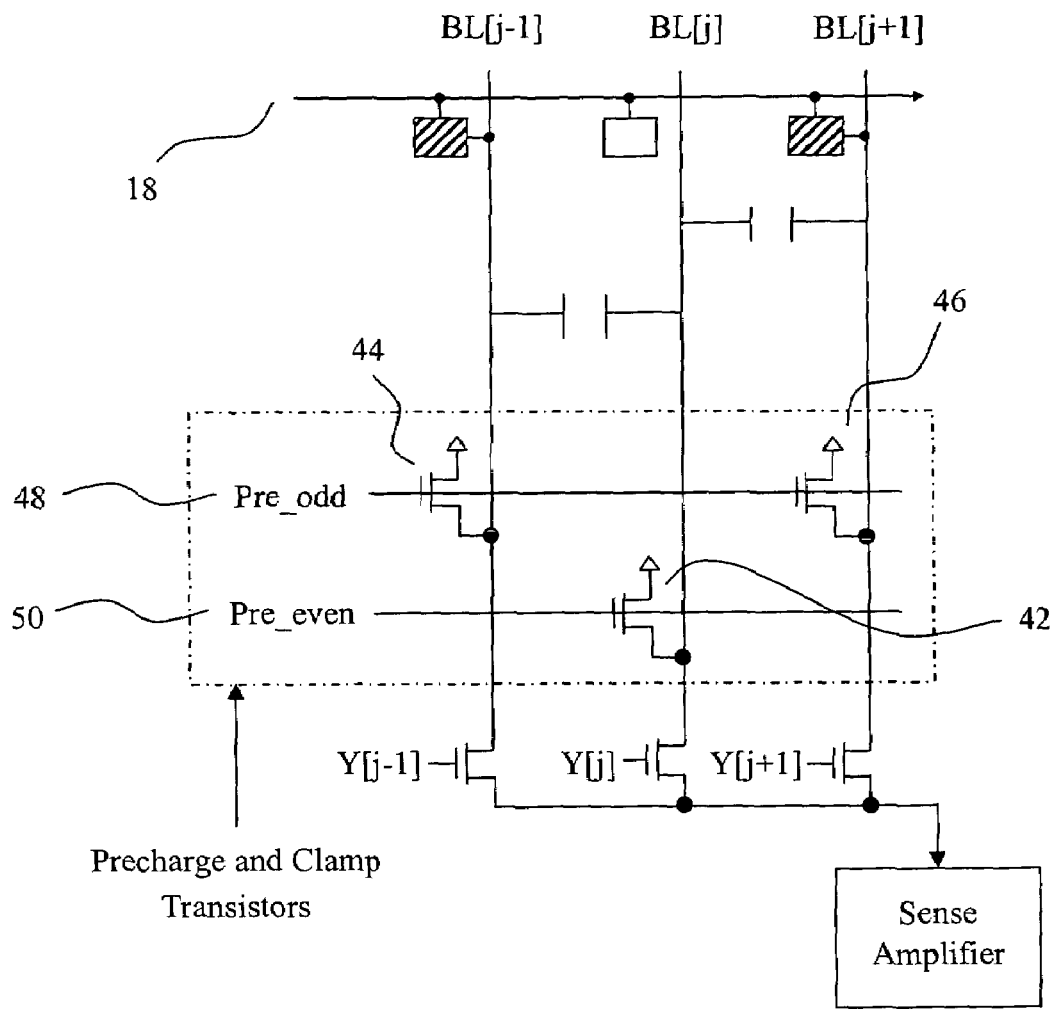
FIG. 5 is a circuit diagram according to another preferred embodiment of the present invention.

FIG. 4 is a circuit diagram according to a preferred embodiment of the present invention. In this embodiment, a via-hole programmable read only memory is taken as an example for description. Referring to FIG. 4, three (i.e., BL[j−1], BL[j] and BL[j+1]) of a plurality of bit lines are used for description. As shown in FIG. 4, these three bit lines each connects the drains of transistors together in the same column of 0-codes. Each word line connects the gates of transistors together in the same row. Precharge transistors 22, 24 and 26 are arranged on the three bit lines, and a precharge control line 20 connects the gates of the precharge transistors 22, 24 and 26, together.

Furthermore, clamp transistors 28, 30, 32, 34, 36 and 38 are arranged on the three bit lines, and are connected to a constant voltage for controlling and keeping the bit lines at a stable voltage. When one of these bit lines is selected, the adjacent bit lines on both sides are fixed to a constant voltage by the clamp transistors. That is, for example, when the bit line BL[j] is selected, the bit lines BL[j−1] and BL[j+1] are fixed to a constant voltage by the corresponding clamp transistors.

In a preferred embodiment of the present invention, the clamp transistors are arranged in matrix on each of the bit lines. And, during a word line pulse having a high logic level, bit lines are fixed to a constant voltage.

As described above, if the bit line BL[j] is selected, the bit line BL[j] including its signal is connected to a sense amplifier by the a column select signal Y[j], and the clamping function is activated on the bit lines BL[j−1] and BL[j+1]. This clamping structure prevents the adjacent bit lines BL[j−1] and BL[j+1] from voltage swing during data sensing. Consequently, this removes the coupling voltage source of the selected bit line. Therefore, the coupling voltage and crosstalk of the selected bit line is eliminated. However, as compared with the prior read only memory, the read only memory of the present invention including clamp transistors occupies more area.

FIG. 5 is a circuit diagram according to another preferred embodiment of the present invention. Referring to FIG. 5, the read only memory comprises a plurality of bit lines, each of which couples the drains of transistors together in the same column of 0-codes; and a plurality of word lines, each of which couples the gates of transistors together in the same row. Each of odd bit lines is arranged with a first transistor. In this embodiment, bit lines BL[j−1] and BL[j+1] are all arranged with first transistors, and even bit lines are all arranged with second transistors. That is, the bit lines BL[j−1] and BL[j+1] are arranged with first transistors 44 and 46, respectively, wherein a first precharge control line 48 couples the gates of the first transistors 44 and 46 of the odd bit lines together, and a second precharge control line 50 couples the gates of the second transistors 42 arranged to the even bit lines (for example, BL[j]) together. When one of the odd bit lines is selected, the even bit lines are fixed to a constant voltage by transistors controlled by a corresponding precharge control line. When one of the even bit lines is selected, the odd bit lines are fixed to a constant voltage by transistors controlled by a corresponding precharge control line. Namely, during a word line pulse having a high logic level, two adjacent bit lines on both sides of the selected bit line and other unselected odd or even bit lines are connected to a voltage by using transistors, thereby maintaining the bit lines at a stable voltage.

In this embodiment, precharge transistors are integrated with clamp transistors in order to reduce extra area occupation and to provide a clamping function. Precharge and clamping signals are programmed by the least bit of a column address so as to control odd or even bit lines, respectively. Consequently, no more area is occupied by the clamp circuit, and only a small additional area is used for a control block to generate odd/even precharge control signals.

In a still further preferred embodiment of the present invention, a third protective method is provided, especially for low-power consumption application. In a general low-power read only memory, a structure with selective precharge is most popular, in which a selected bit line, instead of all bit lines, is precharged in order to reduce current consumption during precharging. However, if bit lines adjacent to any bit line which is selected at a new access cycle have residual voltages left at the previous access cycle (for access to 1-cells), and the adjacent bit lines are used to access 0-cells in the new access cycle simultaneously, the adjacent bit lines still have voltage swing and cause a coupling voltage drop to the selected bit line. Therefore, in the prior art, a selected bit line structure is still under the influence of crosstalk, resulting in read errors.

Thus, the protective technique introduced in this embodiment is used for a selective precharge structure so as to remove residual voltages and to clamp the potentials of adjacent bit lines at the same time. The adjacent bit lines are discharged and clamped to ground during precharging and data sensing, respectively.

Figure 6:
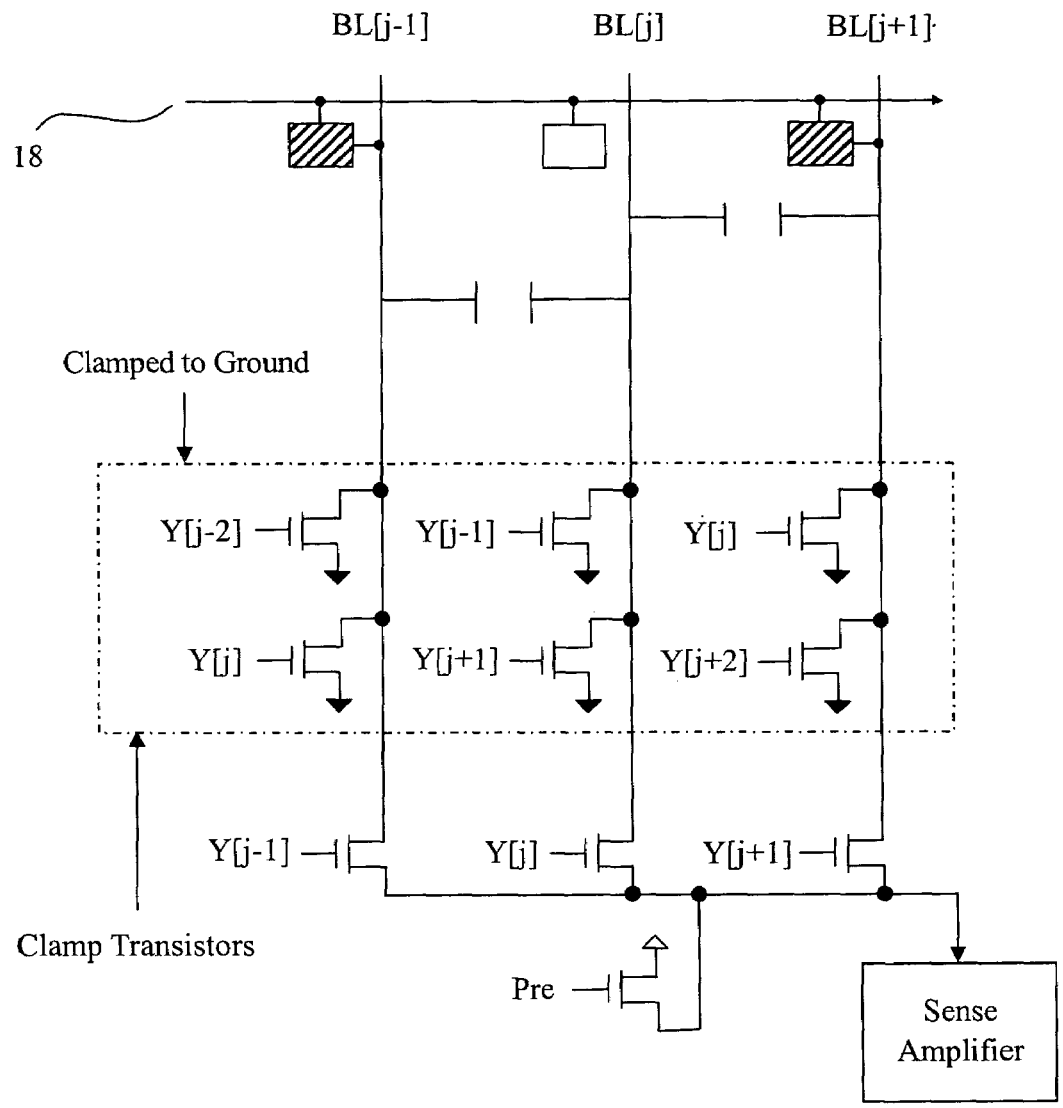
FIG. 6 is a circuit diagram according to a still further preferred embodiment of the present invention.

FIG. 6 shows a circuit diagram of the above-stated embodiment. As described in the other protective techniques, adjacent bit lines, in the third protective technique, do not have voltage swing during data sensing. However, in the third protective technique, the adjacent bit lines are discharged to ground while in the other protective techniques, the adjacent bit lines are precharged to VDD or other different voltages.

In other words, during data sensing period, bit lines have three states: selected-for-reading state, unselected-for-reading state, and clamping state. During precharging period, the all or selected bit lines are precharged.

Although the invention has been disclosed in terms of preferred embodiments, the disclosure is not intended to limit the invention. Those skilled in the art can make changes and modifications within the scope and spirit of the invention which is determined by the claims below.

LIST OF MAJOR ELEMENTS AND ITS CORRESPONDING REFERENCE NUMERALS

| | |
|---|---|
| 18 | Word Line |
| 20 | Precharge Control Line |
| 22~26 | Precharge Transistors |
| 28~38 | Clamp Transistors |
| 40~46 | Clamp Transistors |
| 48 | First Precharge Control Line |
| 50 | Second Precharge Control Line |

What is claimed is:

1. A method for eliminating crosstalk, suitable for a metal programmable read only memory, the read only memory comprises:

a plurality of bit lines, each of which couples the drains of transistors together in the same column;

a plurality of word lines, each of which couples the gates of transistors together in the same row;

a plurality of precharge transistors, arranged on each of the bit lines, and the gates of which are coupled together by a precharge control line; and a plurality of clamp transistors, arranged in matrix on each of the bit lines for clamping a constant voltage, wherein when one of the bit lines is selected, bit lines adjacent to the selected bit line are fixed to a voltage value by the clamp transistors.

2. The method as claimed in claim 1, wherein the bit lines adjacent to the selected bit line are fixed to a voltage value by the clamp transistors during a word line pulse having a high logic level.

3. The method as claimed in claim 1, wherein the read only memory is a read only memory having a metal, contact-hole or via-hole programming layer.

4. The method as claimed in claim 1, wherein the bit lines have three states during data sensing phase: selected-for-reading state, unselected-for-reading state, and clamping state.

* * * * *